United States Patent [19]

Yamada

[11] Patent Number: 5,266,528
[45] Date of Patent: Nov. 30, 1993

[54] METHOD OF DICING SEMICONDUCTOR WAFER WITH DIAMOND AND RESIN BLADES

[75] Inventor: Yutaka Yamada, Kawasaki, Japan

[73] Assignee: Fujitsu Limited, Kanagawa, Japan

[21] Appl. No.: 942,235

[22] Filed: Sep. 9, 1992

[30] Foreign Application Priority Data

Sep. 17, 1991 [JP] Japan ................. 3-235252

[51] Int. Cl.$^5$ ............... H01L 21/302; H01L 21/304; H01L 21/463
[52] U.S. Cl. ................. 437/226; 437/249; 156/645; 156/657; 148/DIG. 28
[58] Field of Search ........... 437/226, 2; 156/643, 156/645; 148/DIG. 28

[56] References Cited

U.S. PATENT DOCUMENTS 4,878,992  11/1989  Campanelli .................. 156/645

FOREIGN PATENT DOCUMENTS 55-72055  5/1980  Japan ................... 437/226

Primary Examiner—Olik Chaudhuri
Assistant Examiner—H. Jey Tsai
Attorney, Agent, or Firm—Nikaido, Marmelstein, Murray & Oram

[57] ABSTRACT

A method of dicing a semiconductor wafer for dividing a semiconductor wafer having a large number of devices formed thereon in a matrix into a large number of chips by the use of a diamond blade, includes the steps of first cutting by the use of the diamond blade in such a manner as to leave a partial residual portion or portions in a direction of thickness of the wafer and to define a plurality of grooves on the wafer in transverse and longitudinal directions, and then cutting the wafer along the grooves by the use of a resin blade having a width equal to or smaller than that of the diamond blade while a feed speed thereof is kept lower than that of the diamond blade.

5 Claims, 1 Drawing Sheet

METHOD OF DICING SEMICONDUCTOR WAFER WITH DIAMOND AND RESIN BLADES

BACKGROUND OF THE INVENTION

1. Field of the Invention

This invention relates to a method of dicing a semiconductor wafer which suppresses the occurrence of cracks in a chip.

2. Description of the Related Art

A large number of chips are produced by fabricating semiconductor integrated circuits such as ICs, LSIs, etc., on a semiconductor wafer of silicon (Si), etc., by a thin film formation technique, photolithography, impurity implantation technique, and so forth, and then dicing the wafer in both transverse and longitudinal directions along scribe lines of the integrated circuits formed in desired patterns, using a diamond blade rotating at a high speed.

Next, the semiconductor chips after dicing are picked up and aligned on a chip tray by the use of a pick-up collet, the semiconductor chips separated individually are mounted to ceramic substrates or ceramic packages by another pick-up collet disposed separately, and thereafter circuit connections are established by effecting wire bonding to bonding pads that have already been formed into a desired pattern, or by flip chip connection.

After the device formation is completed, the semiconductor wafer is mounted and fixed to an adhesive tape, and is sequentially diced in both transverse and longitudinal directions into chips using a diamond blade as shown in FIG. 2.

Here, the diamond blade is produced by mixing fine particles of diamond in a metal such as nickel (Ni), and is referred to as an "electrodeposition blade" owing to its production process.

In the case of a high quality product, a thin film of titanium (Ti) and gold (Au) is formed on the back of the semiconductor wafer for the necessity of soldering by a eutectic solder. In the case of an ordinary product, the back of the semiconductor wafer is directly bonded to an adhesive tape for the purpose of bonding by an adhesive.

When the width of the scribe line, which has already been formed into a pattern, is about 150 $\mu$m, a diamond blade having a tip width of about 80 $\mu$m is used, and when the width of the scribe line is 60 to 90 $\mu$m, a diamond blade having a tip width of about 25 $\mu$m is used. Dicing is carried out to a depth at which the adhesive tape is cut, and when dicing is sequentially repeated along each scribe line in the transverse and longitudinal directions, the chips are separated.

Dicing is generally carried out at a high speed of tens of thousands of revolutions-per-minute (rpm), and a large number of cracks develop on the back of the wafer coming into contact with the adhesive tape because the material of the semiconductor wafer is so hard that the oscillations cannot be absorbed, because the hardness of the semiconductor wafer and that of the adhesive tape are different, and because the occurrence of vibration is unavoidable during the high speed rotation of the diamond blade. In particular, the development of such cracks is notable in so-called tape automated bonding.

Next, after dicing of the wafer is completed, the semiconductor chips are sequentially pushed up from the back of the adhesive tape, are vacuum adsorbed by the pick-up collet and are arranged on the chip tray. During this vacuum adsorption and transfer, a portion of the cracks peels off from the semiconductor chip, scatters to another semiconductor chip, and causes a short-circuit problem during fitting of the semiconductor chip.

In other words, the prior art technology involves the problem that a large number of cracks develop on the separation plane of the semiconductor chips during the dicing process of the semiconductor wafer after the formation of the semiconductor circuit devices, and these cracks scatter and adhere to the plane of other semiconductor chips during a pick-up process.

Japanese Unexamined Patent Publication (Kokai) No. 2-184451 (corresponding to U.S. Pat. No. 4,878,992) discloses two-step dicing in the production of thermal ink-jet print heads. However, the disclosed dicing is for surface chipping and, therefore, the problem of cracks is not caused.

SUMMARY OF THE INVENTION

It is an object of the present invention to suppress the occurrence of cracks during dicing in the production of semiconductor chips.

The object described above can be accomplished by a dicing method comprising first effecting cutting by the use of a diamond blade, when a semiconductor wafer having a large number of devices formed thereon in a matrix is divided into a large number of chips using a diamond blade, the wafer in such a manner as to leave a partial residue or residues in the direction of thickness of the wafer and to form a plurality of grooves on the wafer in transverse and longitudinal directions, and then cutting the wafer along the grooves by the use of a resin blade having a width equal to, or smaller than, that of the diamond blade at a lower feed speed.

DESCRIPTION OF THE PREFERRED EMBODIMENTS

Figure 1A:
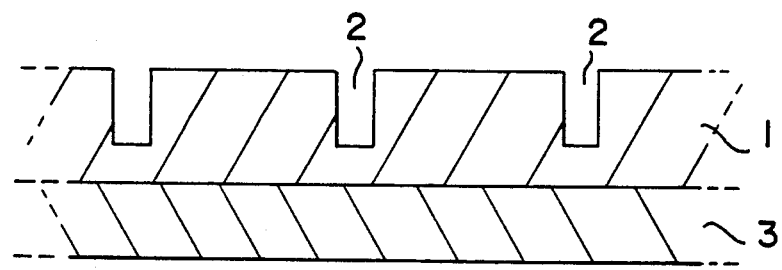
FIGS. 1A and 1B are sectional views for explaining the dicing method according to the present invention.
Figure 1B:
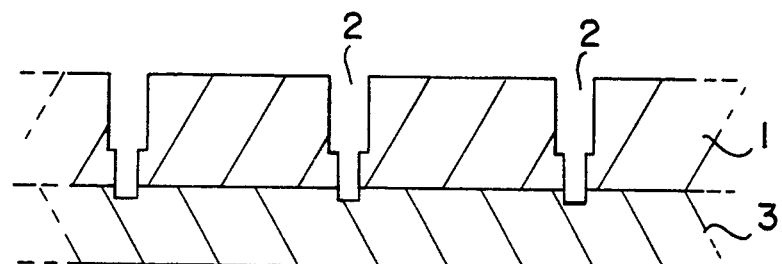
Figure 2:
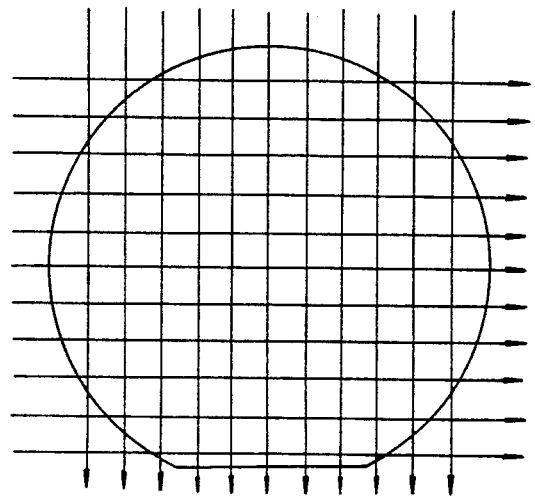
FIG. 2 is a plan view showing a dicing method of a semiconductor wafer.

In an embodiment of the present invention, full cutting of the semiconductor wafer using a diamond blade as has been made in the prior art is not effected, but half-cutting (partial cutting) to a depth not causing the breakage of the semiconductor wafer 1 is made so as to form cut grooves 2 as shown in FIG. 1A, and thereafter each cut groove 2 is cut to the depth reaching an adhesive tape 3 by the use of a resin blade having a width equal to or smaller than that of the diamond blade and softer with respect to the machining surface, at a lower feed speed than that of the diamond blade, as shown in FIG. 1B.

According to the dicing method described above, it becomes possible to suppress the occurrence of cracks resulting primarily from the vibration of the diamond blade, to minimize cracks even when they occur.

When dicing is carried out, downward-cutting (forward rotation) and upper-cutting (rearward rotation) may be effected depending on the rotating direction of the diamond blade and the resin blade, and the method of cutting differs slightly in these cases. However, the present invention can be applied to both of these cases.

The present invention can be applied likewise to the case where dicing is carried out in parallel by the use of a plurality of diamond blades.

Hereinafter, the present invention will be explained in further detail with reference to non-limitative examples.

EXAMPLE 1

LSI devices of a 13 mm-square were fabricated in a matrix on a Si wafer having a diameter of 5 in. and a thickness of 500 μm.

The width of each scribe line was 150 μm.

This Si wafer was then bonded onto an adhesive tape having an adhesive portion of a thickness of 30 μm and a substrate portion of a thickness of 70 μm, or a total thickness of 100 μm, and was then fixed using a frame.

Next, the semiconductor wafer was down-cut into a depth of 400 μm using a diamond blade having a width of 80 μm. The speed of revolution of the diamond blade was 30,000 rpm and its feed speed was 80 mm/sec.

Next, a resin blade produced by burying fine diamond particles of a mean particle size of #1,500 mesh into a phenolic resin and having a width of 50 μm and a diameter of 2 in. was used as a resin blade, and upper-cutting was done at the same speed of revolution as that of the diamond blade but at a feed speed of 10 mm/sec till it reached the substrate portion of the adhesive tape in a depth of 20 μm.

The number of cracks occurring in nine chips was measured. As a result, whereas 200 to 500 cracks were observed by one-step full-cutting according to the prior art, the cutting method according to the present invention could reduce the number of cracks to about 10 to 30.

EXAMPLE 2

LSI devices of a 13.5 mm-square were fabricated in a matrix on a Si wafer having a diameter of 5 in. and a thickness of 550 μm.

The width of each scribe line was 150 μm.

This Si wafer was then bonded onto an adhesive tape having an adhesive portion of a thickness of 20 μm and a substrate portion of a thickness of 70 μm, or a total thickness of 90 μm, and was then fixed using a frame.

Next, the semiconductor wafer was downward-cut to a depth of 450 μm using a diamond blade having a width of 80 μm. The speed of revolution of the diamond blade was 30,000 rpm and its feed speed was 100 mm/sec.

Next, a resin blade produced by burying fine diamond particles of a mean particle size of #1,500 mesh into a phenolic resin and having a width of 70 μm and a diameter of 2 in. was used as a resin blade, and upper-cutting was done at a speed of revolution of 45,000 rpm and at a feed speed of 10 mm/sec till it reached the substrate portion of the adhesive tape in a depth of 30 μm.

The number of cracks occurring in nine chips was 3 to 13.

Where the second dicing by the resin blade was carried out at a speed of revolution of 52,000 rpm, the number of cracks occurring in nine chips was 1 to 2.

As illustrated in the examples given above, the present invention can reduce the number of cracks during dicing of the semiconductor wafer, and can eliminate the short-circuit problem between wires or between the pads of the semiconductor chip during the assembly process of the semiconductor chips.

I claim:

1. A method of dicing a semiconductor wafer for dividing a semiconductor wafer having a large number of devices formed thereon in a matrix and having a tape provided on a back of the semiconductor wafer into a large number of chips by the use of a diamond blade, comprising the steps of:

first effecting cutting by use of said diamond blade so as to leave a partial residual portion or portions in a direction of thickness of said wafer and to define a plurality of grooves on said wafer in transverse and longitudinal directions; and then cutting said wafer along said grooves so that the cutting reaches a surface of the tape by the use of a resin blade having a width equal to or smaller than that of said diamond blade while a feed speed thereof is kept lower than that of said diamond blade.

2. A method according to claim 1, wherein the first cutting by the diamond blade is effected at a speed of revolution of 30,000 rpm and a feed speed of 80 to 100 mm/sec.

3. A method according to claim 1, wherein the second cutting by the resin blade is effected at a speed of revolution of 30,000 to 52,000 rpm and a feed speed of 10 mm/sec.

4. A method of dicing a semiconductor wafer for dividing a semiconductor wafer having a large number of devices formed thereon in a matrix into a large number of chips, the semiconductor wafer further having a tape adhered to a back surface thereof, said method comprising the steps of:

selecting a diamond blade for initially cutting the wafer;

cutting with the diamond blade so as to leave a partial residual portion or portions in a direction of thickness of the wafer therein defining a plurality of grooves on the wafer in transverse and longitudinal directions;

selecting a resin blade having a width equal to or smaller than that of the diamond blade for final cutting of the wafer; and cutting the wafer with the resin blade at a feed speed lower than that used with the diamond blade along the grooves so that said cutting reaches a surface of the tape.

5. A method of dicing a semiconductor wafer for dividing a semiconductor wafer having a large number of devices formed thereon in a matrix into a large number of chips, said method comprising the steps of:

mounting an adhesive tape to a back surface of the semiconductor wafer;

selecting a diamond blade for initially cutting the wafer;

cutting with the diamond blade so as to leave a partial residual portion or portions in a direction of thickness of the wafer therein defining a plurality of grooves on the wafer in transverse and longitudinal directions;

selecting a resin blade having a width equal to or smaller than that of the diamond blade for final cutting of the wafer; and cutting the wafer with the resin blade at a feed speed lower than that used with the diamond blade along the grooves so that said cutting reaches a surface of the adhesive tape.

* * * * *